US011569479B2

(12) United States Patent
Wittmann et al.

(10) Patent No.: US 11,569,479 B2
(45) Date of Patent: Jan. 31, 2023

(54) MULTILAYER ENCAPSULATION, METHOD FOR ENCAPSULATING AND OPTOELECTRONIC COMPONENT

(71) Applicant: OSRAM OLED GmbH, Regensburg (DE)

(72) Inventors: Sebastian Wittmann, Regenstauf (DE); Arne Fleissner, Regensburg (DE); Erwin Lang, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 66 days.

(21) Appl. No.: 17/335,534

(22) Filed: Jun. 1, 2021

(65) Prior Publication Data

US 2021/0359268 A1 Nov. 18, 2021

Related U.S. Application Data

(63) Continuation of application No. 16/830,023, filed on Mar. 25, 2020, now Pat. No. 11,043,654, which is a continuation of application No. 15/768,523, filed as application No. PCT/EP2017/057415 on Mar. 29, 2017, now Pat. No. 10,644,262.

(30) Foreign Application Priority Data

Apr. 13, 2016 (DE) .......................... 102016106846.2

(51) Int. Cl.
*H01L 51/52* (2006.01)
*H01L 51/50* (2006.01)

(52) U.S. Cl.
CPC ...... *H01L 51/5256* (2013.01); *H01L 51/5056* (2013.01); *H01L 2251/558* (2013.01)

(58) Field of Classification Search
None
See application file for complete search history.

(56) References Cited

U.S. PATENT DOCUMENTS

| 8,658,442 | B2 | 2/2014 | Schmid et al. |
| 9,236,581 | B2 | 1/2016 | Kato et al. |
| 9,252,394 | B2 | 2/2016 | Xie |
| 2013/0122217 | A1 | 5/2013 | Akagi |
| 2014/0151656 | A1 | 6/2014 | Zeng et al. |
| 2014/0254112 | A1 | 9/2014 | Okumoto et al. |

(Continued)

FOREIGN PATENT DOCUMENTS

| DE | 10318187 A1 | 11/2003 |
| DE | 102014107264 A1 | 6/2015 |

(Continued)

*Primary Examiner* — Whitney Moore
(74) *Attorney, Agent, or Firm* — Botos Churchill IP Law LLP (57) ABSTRACT

A multilayer encapsulation, a method for encapsulating and an optoelectronic component are disclosed. In an embodiment an optoelectronic component includes a first electrode layer, an organic light-emitting layer stack abutting the first electrode layer, a second electrode layer abutting the light-emitting layer stack and a multilayer encapsulation abutting the second electrode layer, wherein the multilayer encapsulation comprises a barrier layer and a planarization layer, wherein the planarization layer abuts the second electrode layer, and wherein the planarization layer is arranged between the second electrode layer and the barrier layer.

15 Claims, 4 Drawing Sheets

(56) References Cited

U.S. PATENT DOCUMENTS

| | | |
|---|---|---|
| 2016/0005998 A1 | 1/2016 | Chen et al. |
| 2016/0059261 A1 | 3/2016 | Nishio |
| 2017/0133638 A1 | 5/2017 | Takahashi et al. |
| 2018/0108866 A1 | 4/2018 | Kim et al. |

FOREIGN PATENT DOCUMENTS

| | | |
|---|---|---|
| EP | 2455220 A1 | 5/2012 |
| KR | 100779003 B1 | 11/2007 |

FIG 4B

MULTILAYER ENCAPSULATION, METHOD FOR ENCAPSULATING AND OPTOELECTRONIC COMPONENT

CROSS-REFERENCE TO RELATED APPLICATIONS

This application is a continuation of U.S. patent application Ser. No. 16/830,023, filed Mar. 25, 2020, now allowed, which is a continuation of U.S. patent application Ser. No. 15/768,523, filed Apr. 13, 2018, now U.S. Pat. No. 10,644,262, which is a national phase entry under 35 U. S. C. § 371 of International Application No. PCT/EP2017/057415, filed Mar. 29, 2017, published as International Publication No. WO 2017/178233, which claims priority to German Patent Application No. 102016106846.2, filed Apr. 13, 2016, the disclosures of which are hereby incorporated herein by reference.

TECHNICAL FIELD

A multilayer encapsulation, a method for encapsulating a component and an optoelectronic component comprising a multilayer encapsulation are indicated.

SUMMARY OF THE INVENTION

Embodiments provide an encapsulation with improved properties. Further embodiments provide an improved and simplified method for forming an encapsulation. Other embodiments provide a component that is better encapsulated.

A multilayer encapsulation is indicated according to at least one embodiment. "Multilayered" means here and in the following a sequence of layers comprising at least two layers. The layers of the layer sequence are arranged one above the other, so that two layers each have a common interface parallel to their main direction of extension. At least one layer of the layer sequence can be structured, so that not all layers of the layer sequence have the same area along their main extension direction.

According to an embodiment, the multilayer encapsulation comprises a layer sequence comprising at least one barrier layer and at least one planarization layer. Either a barrier layer or a planarization layer can be placed on the outer surface of the encapsulation. The outer surface of the encapsulation is the side of the encapsulation facing away from an element to be encapsulated. Correspondingly, either a barrier layer or a planarization layer can be arranged on the side of the encapsulation facing towards an element to be encapsulated. The element to be encapsulated can be a component, such as an optoelectronic component, in particular an organic light-emitting diode (OLED), which can be rigid or flexible.

According to one embodiment, the barrier layer and the planarization layer together have a lower water permeability than the barrier layer. This means that the planarization layer has barrier properties in addition to its planarization properties. At a layer thickness of 200 nm, the planarization layer can have a permeability for water (WVTR, Water Vapor Transition Rate) of $10^{-4}$ g/dm$^2$, in combination with a barrier layer, the water permeability for such layers can be less than $10^{-6}$ g/dm$^2$. Such a low water permeability is necessary for the encapsulation of OLEDs, for example. Furthermore, the planarization layer in combination with the barrier layer can have an oxygen permeability of less than or equal to $10^{-6}$ cm$^3$/m$^2$d, which is also advantageous for the encapsulation of OLEDs.

The encapsulation is therefore suitable for the use in OLEDs. Due to the low WVTR value of the encapsulation, the organic layers of an OLED are reliably protected against water and oxygen degradation, which is especially relevant for the automotive use of OLEDs.

According to an embodiment, a multilayer encapsulation is indicated which comprises a layer sequence comprising at least one barrier layer and at least one planarization layer, and the barrier layer and the planarization layer together have a lower water permeability than the barrier layer.

According to one embodiment, the barrier layer contains inorganic material. In particular, the barrier layer may contain a metal oxide. The metal oxide may be selected from a group comprising alumina, zirconium oxide, hafnium oxide, tantalum oxide, zinc oxide, lanthanum oxide, titanium oxide and combinations thereof. The barrier layer can comprise at least two sub-layers, each of which comprises a metal oxide. The metal oxides of the sub-layers can be different from each other. The sub-layers of the barrier layer can thus form a multilayer laminate or nanolaminate. The barrier layer preferably contains alumina. The thickness of the barrier layer can range from 10 nm up to 300 nm inclusive, in particular from 30 nm up to 100 nm inclusive, preferably from 40 nm up to 60 nm inclusive, for example, at 50 nm. Inorganic material, in particular metal oxides, have low water and gas permeabilities, in particular very low gas permeabilities, and are therefore well suited for the use in a barrier layer. For example, the gas and/or water permeability of the barrier layer can, under favorable conditions, be less than $10^{-6}$ cm$^3$/m$^2$d at a layer thickness of >50 nm. Particular low water and gas permeabilities of the barrier layer are particularly achieved if the barrier layer is applied to planar, defect-free surfaces with possibly the same properties, such as thermal expansion coefficients. Such a surface can be provided by the planarization layer, which has very good planarization properties and can also overcast particles. Furthermore, metal oxides for the production of the barrier layer can be applied relatively easily, for example, by means of atomic layer deposition (ALD).

According to an embodiment, the barrier layer contains inorganic material selected from a group comprising SiN, SiO$_2$, SiC or combinations thereof. These materials can be applied by means of CVD (Chemical Vapor Deposition), for example. The barrier layer can comprise at least two sub-layers, one of which comprises a metal oxide and one sub-layer comprises one of SiN, SiO$_2$ or SiC. The barrier layer can thus form a multilayer laminate consisting of metal oxide sub-layers and sub-layers containing SiN, SiO$_2$ or SiC.

According to one embodiment, the planarization layer contains an inorganic vitreous material. The term "vitreous" refers to an amorphous material obtained, for example, by means of a curing process. In particular, the vitreous material can be obtained from perhydropolysilazane (PHPS). The planarization layer can have a roughness (root mean square roughness, rms), which is selected from the range <200 nm, in particular <50 nm, preferably <10 nm. This means that the planarization layer has particularly good planarization properties and is therefore suitable, for example, as a surface for a barrier layer. The low roughness values can be achieved, for example, by liquid phase processing of a starting material for the planarization layer, such as PHPS. In addition to its low permeability to water, the planarization layer can have little or no gas emission of volatile organic compounds.

The inorganic vitreous material may be selected from a group comprising $SiO_2$-containing material and SiON-containing material. The term "$SiO_2$-containing material" and "SiON-containing material" shall mean here and in the following a material which contains $SiO_2$ or SiON to a large extent, but which may also contain small amounts of residues of the starting material or other reaction products of the starting material which may be produced during the manufacturing process, depending on the production conditions. However, the properties of the respective material are determined by the main component, $SiO_2$ or SiON, i.e., they are similar or identical to the properties of $SiO_2$ or SiON.

Thus, a barrier layer with very low gas permeability and a planarization layer with very low water permeability are combined in the encapsulation. This enables a WVTR value of the encapsulation to be achieved suitable for the use in OLEDs. Furthermore, possibly existing pinholes in the barrier layer, which can be formed in the area of and around particles, can be decoupled from the planarization layer or the particles can be overcast and thus sealed.

The encapsulation is flexible in accordance with one embodiment. That means it's malleable. This means that it can also be used for encapsulation in flexibly shaped components such as flexible OLEDs.

The encapsulation can also be transparent. This is particularly advantageous when encapsulation is used in optoelectronic components such as OLEDs.

The planarization layer can be structured according to another embodiment. For example, it may have a smaller area parallel to its main direction of extension than the barrier layer, so that the barrier layer also surrounds lateral edges of the planarization layer. This can also be used to reduce or prevent lateral diffusion of water or oxygen, for example, through the planarization layer.

The thickness of the planarization layer can be selected from the range including 50 nm up to and including 1.2 μm. The thickness of the planarization layer can vary depending on the manufacturing process. For example, if the planarization layer is obtained by a UV curing process, the thickness of the resulting planarization layer may be selected from the range including 50 nm up to and including 500 nm, in particular including 200 nm up to and including 300 nm. For example, if the planarization layer is obtained by a temperature curing process, the thickness of the resulting planarization layer may be selected from the range including 50 nm to 1200 nm inclusive, in particular including 800 nm to 1200 nm inclusive.

According to another embodiment, the planarization layer may comprise a laminate of sub-layers, at least one sub-layer containing a polymer. For example, a polymer-containing sub-layer may be placed between two sub-layers containing an inorganic vitreous material. This means that the planarization layer can be highly flexible, which enables improved encapsulation of flexible OLEDs, for example.

According to another embodiment, the planarization layer has a top surface, a bottom surface and lateral edges and a common interface with the barrier layer at the top and/or bottom surface. This means that the multilayer encapsulation is arranged either with a barrier layer or with a planarization layer on an element to be encapsulated.

If a planarization layer is located on an element to be encapsulated as the first layer of the encapsulation, a barrier layer is arranged on its top surface. If a further planarization layer is arranged on the barrier layer, it is arranged with its bottom surface on the barrier layer.

If a planarization layer is arranged as the topmost layer, i.e., on the side of the encapsulation facing away from an element to be encapsulated, the property of protecting it from mechanical damage comes into play in addition to its planarization and barrier properties. The encapsulation is thus particularly robust. If the planarization layer is applied directly onto an element to be encapsulated, it planarizes the surface of the element to be encapsulated, thus facilitating the application of additional layers, such as the barrier layer. Due to the very good planarization properties of the planarization layer, the barrier layer can be applied very homogeneously.

The planarization layer may also have a common interface with the barrier layer at the lateral edges. This means that the planarization layer is structured and has a lower lateral expansion along its main direction of extension than the barrier layer and the barrier layer also surrounds the planarization layer laterally. This prevents lateral penetration of oxygen and/or water and/or other gases through the planarization layer.

Further embodiments provide an optoelectronic component. The optoelectronic component may comprise a substrate, a first electrode layer on the substrate, a light-emitting layer stack on the first electrode layer, and a second electrode layer on the light-emitting layer stack. Furthermore, the optoelectronic component may comprise a multilayer encapsulation according to the above-mentioned embodiments, which is arranged on the second electrode layer and laterally of the light-emitting layer stack and the first electrode layer. The encapsulation thus completely surrounds the light-emitting layer stack and protects it from the ingress of oxygen and water.

This means that all the features disclosed in connection with encapsulation are also disclosed for the optoelectronic component and vice versa.

The optoelectronic component can include additional layers, such as a protective layer, which is arranged on the encapsulation and additionally protects against mechanical damage.

The layer sequence of the encapsulation can be arranged in the optoelectronic component such that a barrier layer or a planarization layer is arranged on the side of the encapsulation facing the light-emitting layer stack and on the side of the encapsulation facing away from the light-emitting layer stack.

The term "light-emitting layer stack" may refer here and in the following to an electromagnetic radiation-emitting layer stack. Thus, the optoelectronic component can emit electromagnetic radiation, which can be either visible or invisible.

The light-emitting layer stack can, for example, be an organic functional layer stack. It may have layers with organic polymers, organic oligomers, organic monomers, organic small molecules or combinations thereof. Furthermore, it can have at least one organic light emitting layer. Materials suitable as materials for the organic light-emitting layer are those that emit radiation due to fluorescence or phosphorescence. The organic functional layer stack can also have a functional layer, which is designed as a hole transport layer to allow effective hole injection into the at least one light-emitting layer. The organic functional layer stack can also have a functional layer that is formed as an electron transport layer. In addition, the layer stack can also have electron and/or hole blocking layers.

The fact that a layer or element is arranged or applied "on" or "above" another layer or another element may here and in the following mean that one layer or element is directly in direct mechanical and/or electrical contact with the other layer or element. Furthermore, it can also mean that one layer or element is arranged indirectly on or above the other layer or element. Further layers and/or elements can then be arranged between one and the other layer or between one and the other element.

According to another embodiment, the optoelectronic component can be an OLED. The OLED can be designed flexible. Furthermore, the OLED can be a top- or bottom-emitting OLED or it can be designed to emit radiation on both sides. Due to the encapsulation, the water and oxygen-sensitive organic layers of the OLED are particularly well protected.

Further embodiments provide a method for encapsulating a component.

According to one embodiment, the method may comprise the method steps applying a barrier layer and producing a planarization layer. The method steps can be carried out in the specified order or in reverse order. In addition, the method steps can be carried out at least once in each case if they are carried out alternately. First, a barrier layer can be applied to the component to be encapsulated and then a planarization layer can be produced on the barrier layer, or a planarization layer can be produced on the component to be encapsulated and a barrier layer can be applied to the planarization layer. A further barrier layer or planarization layer can then be applied to the last applied layer.

The "application" of a barrier layer may be understood as the growth of a barrier layer. Growing a barrier layer on top of a planarization layer can lead to a particularly homogeneously formed barrier layer due to the good planarization properties of the planarization layer.

In accordance with an embodiment, a precursor material is applied to produce the planarization layer, which is then cured. This means that a simple application method can be combined with a fast-curing process, resulting in a time- and cost-saving method.

According to an embodiment, the method is used to encapsulate a component, comprising the steps of applying a barrier layer and producing a planarization layer, wherein a precursor material is applied to produce the planarization layer, the precursor material being then cured, and wherein the method steps are carried out alternately at least once in each case.

The method can be used to produce a component with encapsulation as described above. All the features disclosed in connection with the encapsulation are thus also disclosed for the process and vice versa. Furthermore, the method can be used to encapsulate an optoelectronic component as described above. All features disclosed in connection with the component are thus also disclosed for the method and vice versa.

According to one embodiment, the precursor material may comprise perhydropolysilazane (PHPS). In particular, the precursor material may comprise a PHPS solution. For example, the precursor material may be a 20% PHPS solution in dibutyl ether. When a PHPS-containing layer is cured, a planarization layer results that alone has a low water permeability of $10^{-4}$ g/dm$^2$ at a layer thickness of 200 nm. In combination with the barrier layer, the water permeability may be less than or equal to $10^{-6}$ g/dm$^2$. Thus, such an encapsulation is suitable for an encapsulation of OLEDs, which have to be hermetically encapsulated because of their sensitivity to water and oxygen.

According to an embodiment, the precursor material can be applied by a method selected from a group comprising spin coating, slot die coating, spray coating, stencil printing, inkjet printing and combinations thereof. In particular, the precursor material can be applied using slot die coating. This allows the precursor material to be applied for the planarization layer by means of a cheap and fast process. By the application of the precursor material, in particular PHPS or a PHPS solution by means of slot die coating, a process-related, very uniform overcast of possible present particles or of surfaces with a certain topology to which the precursor material is applied, results. Conventional inorganic buffer layers applied by means of CVD processes, for example, have thinner layer thicknesses in the area of particles or topologies as a result of shadowing effects. Such shadowing effects can be avoided or at least reduced by applying PHPS or a PHPS solution using one of the above-mentioned methods, in particular by means of slot die coating.

The precursor material is applied in a structured manner according to one embodiment. For this purpose, the precursor material can be applied using a method selected from slot die coating, spray coating, inkjet printing or stencil printing. In particular, the precursor material can be applied by means of a spraying method such as spray coating. Edge areas of the component to be encapsulated or the barrier layer already applied to it can be spared, so that the barrier layer or another barrier layer applied to the planarization layer surrounds the planarization layer also laterally. This reduces or prevents possible lateral diffusion through the planarization layer.

Furthermore, the precursor material can be cured by a method selected from a group comprising temperature curing and UV curing. The temperature curing can include a temperature curing under water vapor atmosphere. Both curing methods are unproblematic for the component to be encapsulated.

The precursor material can be cured by UV curing. For example, UV radiation (e.g., 172 nm xenon) is applied to the precursor material in a reduced oxygen atmosphere. Curing may take 1 to 3 minutes, for example. If the precursor material is cured by UV curing, a planarization layer containing SiON-containing material can be formed. Such a layer can be formed very dense. UV irradiation, for example, creates from PHPS an inorganic vitreous material containing mainly SiON. Residues of PHPS or other reaction products produced by irradiation can also be present in small quantities in the planarization layer. Due to the relatively short UV irradiation, it can be prevented that a component to be encapsulated is damaged.

Furthermore, the precursor material can be cured by means of temperature curing. The temperature curing can be carried out at temperatures ranging from 80° C. inclusive up to and including 200° C., in particular at ≤90° C. For example, the temperature can be 80° C. Curing by means of temperature can last from 10 minutes to 1 hour. Furthermore, the temperature curing can take place under water vapor atmosphere. The execution under water vapor makes it possible to cure at particularly low temperatures, such as 80° C., for example. Especially at low temperatures, no damage to the element to be encapsulated can be expected. If the precursor material is cured by temperature curing, a planarization layer can be formed containing SiO$_2$-containing material. Thus, a vitreous material is formed which, in addition to SiO$_2$, may also contain small amounts of the precursor material, in particular PHPS, or other reaction products. Curing at relatively low temperatures is also unproblematic for many encapsulated components such as OLEDs.

According to another embodiment, the barrier layer can be applied by a method selected from a group, comprising ALD (Atomic Layer Deposition), MLD (Molecular Layer Deposition), CVD (Chemical Vapor Deposition), PECVD (Plasma Enhanced Chemical Vapor Deposition), sputtering and combinations thereof. In particular, the barrier layer can be applied using ALD. This allows a very homogeneous layer growth with the resulting excellent barrier effect. If a barrier layer is applied with at least two sub-layers, each sub-layer can be applied using the same or different methods. Furthermore, the same or different barrier layer material can be applied for each sub-layer. The barrier layer or a single sub-layer of the barrier layer can also be produced with a combination of application methods and/or a combination of materials. The materials of the barrier layer, which are applied with one or more of the methods mentioned above, can include metal oxides. In particular, the metal oxides may be selected from a group comprising alumina, zirconium oxide, hafnium oxide, tantalum oxide, zinc oxide, lanthanum oxide, titanium oxide and combinations thereof.

In this method, for example, a first barrier layer can be applied to the component using ALD. A first planarization layer can be produced by applying PHPS using, for example, Slot Die Coating and curing by means of temperature curing or UV curing. For example, a second barrier layer can be applied to the thus obtained inorganic vitreous material by means of ALD. Due to the very good planarization properties of PHPS and the resulting inorganic vitreous material, the second barrier layer grows very homogeneously. Alternatively, it is also possible to produce from PHPS a planarization layer underneath the first barrier layer in order to planarize the surface of the component to be encapsulated. Furthermore, a planarization layer made of PHPS can be produced on top of the last applied barrier layer as additional protection against mechanical damage. Furthermore, conventional encapsulations such as a PECVD and ALD layer combination can be improved by applying a planarization layer either underneath the PECVD layer or over the ALD layer. The method can also be used to produce a barrier layer embedded between two planarization layers.

In accordance with another embodiment, the method can be used to encapsulate a component comprising an organic light-emitting layer stack. Thus, an optoelectronic component such as an OLED comprising an encapsulation can be produced by this method. The OLED can be rigid or flexible. Because the encapsulation is transparent, the OLED can be top, bottom or double-sided emitting.

BRIEF DESCRIPTION OF THE DRAWINGS

Further arrangements and exemplary embodiments are explained below with regard to the figures.

In the exemplary embodiments and figures, identical, like or similar elements can each be provided with the same reference signs. The depicted elements and their proportions among each other are not to be regarded as true to scale, but rather individual elements, such as layers, components, devices and areas, can be exaggeratedly large for better representation and/or better understanding.

DETAILED DESCRIPTION OF ILLUSTRATIVE EMBODIMENTS

Figure 1:
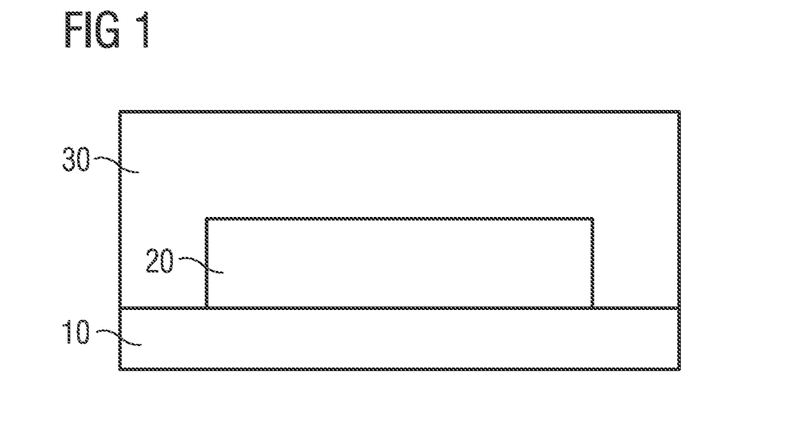
FIG. 1 shows the schematic side view of an optoelectronic component.

FIG. 1 shows the schematic side view of an optoelectronic component according to one embodiment. A layer stack 20 is arranged on the substrate 10, which is surrounded by an encapsulation 30. The layer stack 20 can be an organic light-emitting layer stack. The first and second electrode layers, which are arranged below or above the light-emitting layer stack 20 and with which the layer stack 20 can be electrically contacted, are not explicitly shown. The encapsulation 30 is arranged on the layer stack 20 and laterally with respect to the layer stack 20 and, together with substrate 10, includes layer stack 20. The optoelectronic component in FIG. 1, for example, is an OLED that can be either rigid or flexible.

In the following, the encapsulation 30 is shown and described in schematic side views, whereby each exemplary embodiment shown in FIGS. 2 to 6 can be applied to a layer stack 20 as shown in FIG. 1. The encapsulations 30 shown in FIGS. 2 to 6 may be encapsulations of OLEDs, for example.

Figure 2:
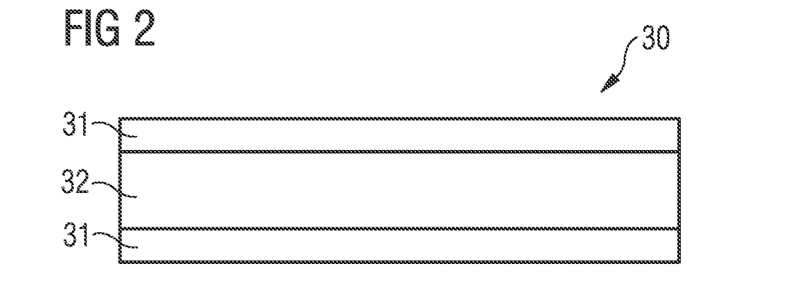
FIG. 2, FIG. 3, FIGS. 4A-4B, FIGS. 5A-5C and FIGS. 6A-6B show schematic side views of encapsulations according to different embodiments.

FIG. 2 shows the schematic side view of an encapsulation 30, which has a planarization layer 32, on the top and bottom side of which in each case a barrier layer 31 is arranged. In this example, the planarization layer 32 is a layer made of PHPS, the barrier layers 31 each contain a metal oxide. The layer thickness of the barrier layer 31 is about 50 nm. The thickness of the planarization layer 32 may vary depending on the manufacturing method. If the planarization layer 32 is obtained by a UV curing process, the thickness of the resulting planarization layer 32 is selected from the range including 50 nm up to and including 500 nm, in particular including 200 nm up to and including 300 nm. If the planarization layer 32 is obtained by a temperature curing process, the thickness of the resulting planarization layer 32 may be selected from the range including 50 nm up to and including 1200 nm, in particular including 800 nm up to and including 1200 nm.

The barrier layers 31 can be applied by means of ALD, CVD, PECVD, sputtering or MLD, for example. ALD is preferred, as a very homogeneous layer growth with a resulting very good barrier effect of barrier layer 31 is achieved. The metal oxide is, for example, alumina, zirconium oxide or titanium oxide. For example, if an alumina layer is produced by means of ALD, trimethyl aluminium and water can be applied to the surface to be encapsulated or the element to be encapsulated or the existing planarization layer, and $Al_2O_3$ can be formed. If MLD is used for production an alcohol or dialcohol is used instead of water, which leads to an alumina containing organic residues. This method is used when particularly flexible barrier layers 31 are to be produced.

To produce the planarization layer 32, PHPS, especially a 20% solution of PHPS in dibutyl ether, is first applied to the surface to be encapsulated or the element to be encapsulated or, in this example, the already existing barrier layer 31 by means of spin coating, slot die coating, spray coating or inkjet printing.

Depending on the curing conditions of the subsequent curing of the PHPS, different material properties of the resulting planarization layer 32 are obtained. In case PHPS is cured by UV curing, a very dense SiON-containing planarization layer 32 is obtained. For this, the PHPS layer is irradiated with a 172 nm Xe lamp for about 1 to 3 minutes under a reduced oxygen atmosphere. A dense $SiO_2$-containing planarization layer 32 is formed when cured at elevated temperatures, e.g. at 80° C. in a water vapor atmosphere for 10 minutes to one hour.

The completed planarization layer 32 has a water permeability of $10^{-4}$ g/dm$^2$ for 200 nm layer thickness, together with the barrier layers 31 the encapsulation 30 has a water permeability of less than $10^{-6}$ g/dm$^2$.

Figure 3:
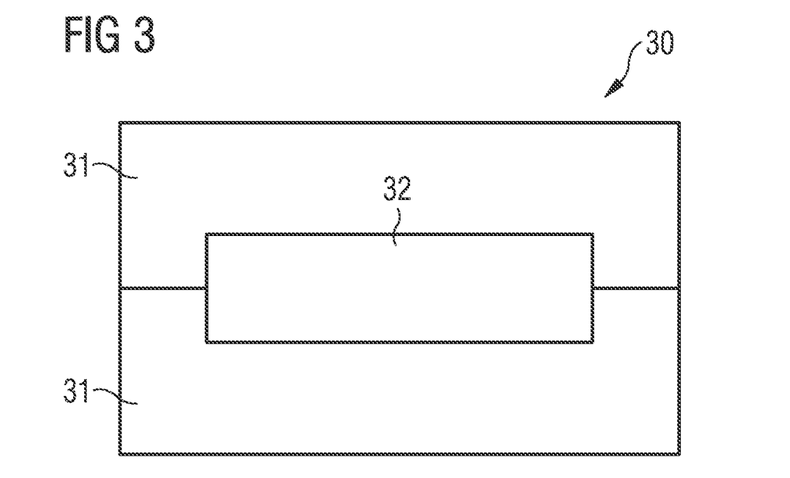

FIG. 3 shows the schematic side view of another exemplary embodiment of the encapsulation 30. The arrangement of planarization layer 32 and barrier layers 31 corresponds to that of FIG. 2, with the planarization layer 32 being applied in a structured manner so that the barrier layers 31 also surround the planarization layer 32 laterally. In order to obtain such a structuring of the planarization layer 32, PHPS can be applied by means of slot die coating, spray coating, inkjet printing and stencil printing. The further fabrication of the planarization layer 32 and the barrier layer 31 as well as their materials correspond to those manufacturing methods and materials mentioned with respect to FIG. 2.

The structured application of PHPS causes an encapsulation 30, which also laterally reduces or prevents the diffusion of water or oxygen through the lateral edges of the planarization layer 32.

Figure 4A:
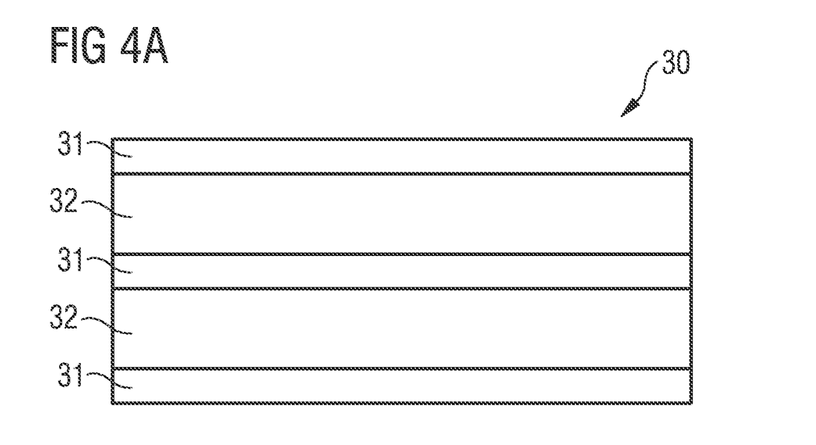
Figure 4B:
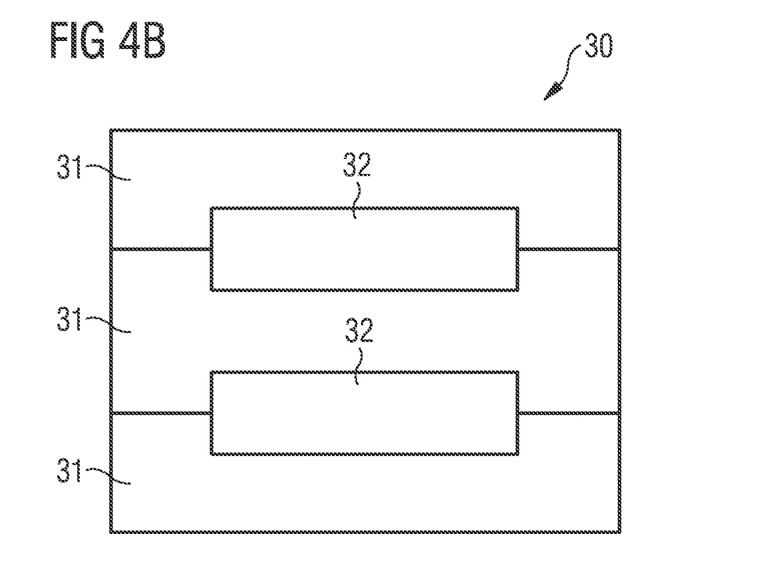

FIG. 4 shows the schematic side view of encapsulations 30, which are multilayered.

In FIG. 4a, the encapsulation 30 is formed from a first barrier layer 31, a planarization layer 32 arranged on top of it, a further barrier layer 31, a further planarization layer 32 arranged on top of it and a third planarization layer 31. The fabrication and materials of barrier layers 31 and planarization layers 32 correspond to those specified in FIG. 2. The alternating arrangement of barrier layers 31 and planarization layers can be continued as desired, depending on the desired thickness, flexibility and permeability of water, oxygen and other gas of the encapsulation.

FIG. 4b shows the schematic side view of an encapsulation 30, which is constructed analogously to the encapsulation 30 shown in FIG. 4A, whereby the planarization layers 32 are structured here, so that they are also surrounded laterally by the barrier layers 31. Here, too, a continuation of the alternating stacked barrier layers 31 and planarization layers 32 is conceivable. The fabrication and materials of barrier layers 31 and planarization layers 32 correspond to those specified in FIG. 2 or, as far as the structured application of planarization layers 31 is concerned, to the fabrication mentioned with respect to FIG. 3.

Figure 5A:
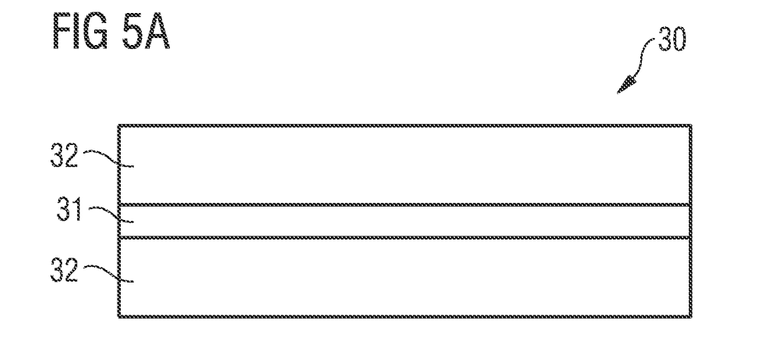
Figure 5B:
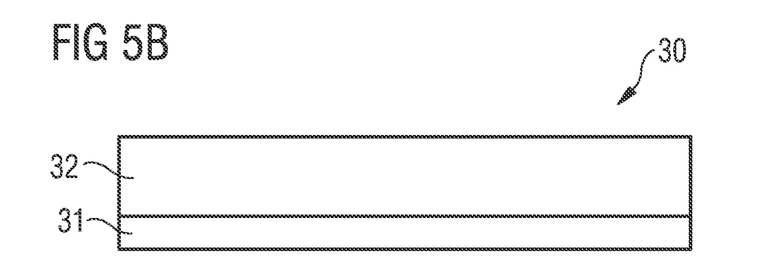
Figure 5C:
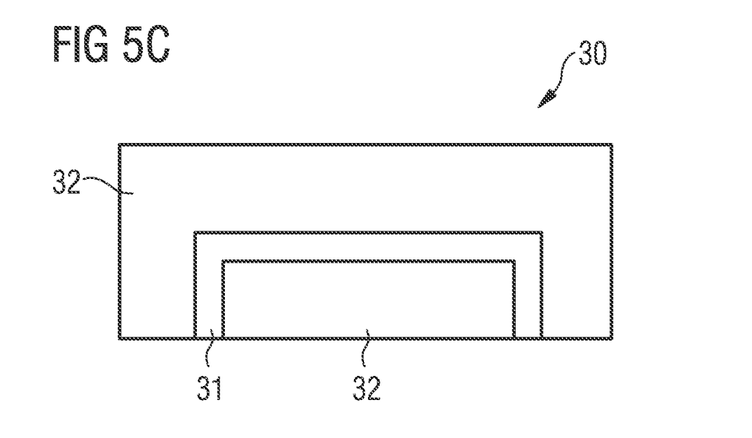

FIG. 5 shows the schematic side view of exemplary embodiments of encapsulations 30, in which the planarization layer 32 also serves as a protective layer for barrier layer 31. In these exemplary embodiments, the encapsulation 30 ensures a very low water and oxygen permeability and at the same time a mechanical protection of the encapsulated element, for example, an encapsulated OLED.

In FIG. 5a, a barrier layer 31 is arranged on a planarization layer 32 and a further planarization layer 32 is arranged on the barrier layer 31. In such an encapsulation 30, the planarization layer 32 serves as a protective layer for the barrier layer 31. The planarization layer 32 is thus the outer layer of the encapsulation and can protect the encapsulation and the encapsulated component from mechanical damage. The fabrication and materials of barrier layers 31 and planarization layers 32 correspond to those specified in FIG. 2.

FIG. 5b shows an alternative exemplary embodiment in which the lower planarization layer 31 is not present. This means that the barrier layer 31 is applied directly to an OLED, for example, and a planarization layer 32 applied to it is used as an outer protective layer. The fabrication and materials of barrier layers 31 and planarization layers 32 correspond to those specified in FIG. 2.

Another alternative is shown in FIG. 5c. Here, the lower planarization layer 31 is structured so that it is also laterally surrounded by the barrier layer 31 applied to it and the further planarization layer 32 applied to the barrier layer 31. The fabrication and materials of barrier layers 31 and planarization layers 32 correspond to the fabrication mentioned in FIG. 2 or, as far as the structuring of planarization layer 32 is concerned, to the fabrication mentioned with respect to FIG. 3. This structure reduces or prevents potential lateral penetration of water or oxygen through the planarization layer 32.

Figure 6A:
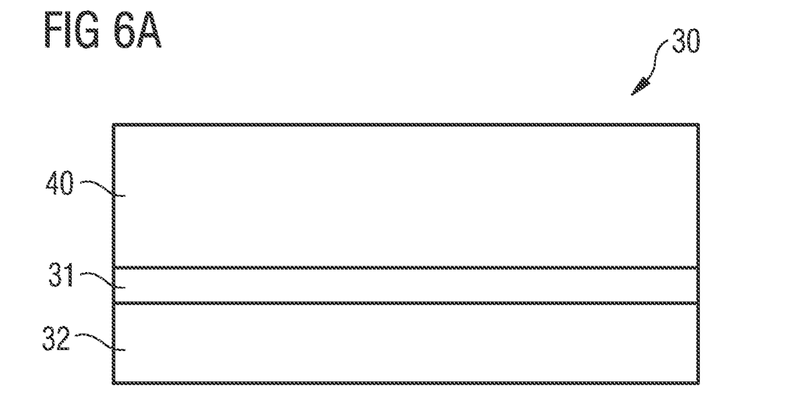
Figure 6B:
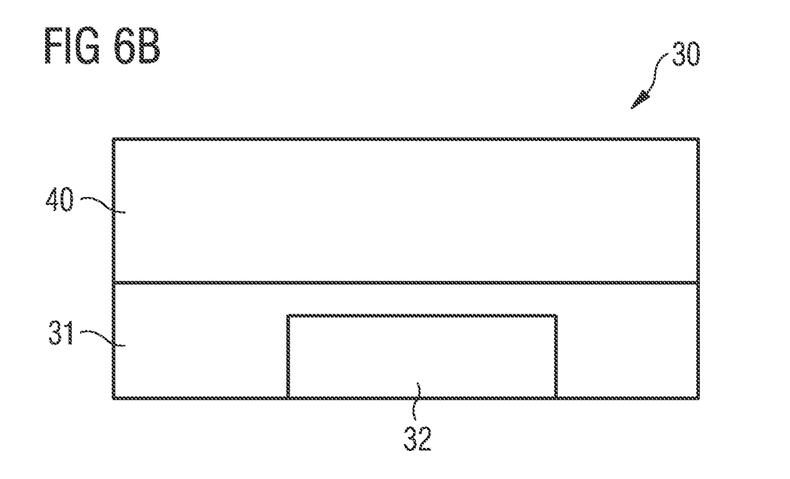

FIG. 6 shows further exemplary embodiments of the encapsulation 30 in a schematic side view. A further layer, a protective layer 40, is shown here, which is applied to a barrier layer 31, which in turn is applied to a planarization layer 32. The protective layer 40 can be an organic protective layer or a varnish on which laminated plastic or metal foils, for example, are applied as additional scratch protection. The protective layer 40 serves to protect the barrier layer 31 from mechanical damage. In this example of the encapsulation 30, the planarization layer 32 has the function of planarization and thus improved adhesion for the barrier layer 31. Fabrication and materials of the barrier layers 31 and the planarization layers 32 correspond to those mentioned in FIG. 2.

FIG. 6b shows the planarization layer 32 being structured so that it is also laterally surrounded by barrier layer 31. Incidentally, this example corresponds to the one shown in FIG. 6a.

The invention is not limited by the description based on the examples. Rather, the invention covers each new feature and each combination of features, which includes in particular any combination of features in the patent claims, even if this feature or combination itself is not explicitly stated in the patent claims or exemplary embodiments.

The invention claimed is:

1. An optoelectronic component comprising: a first electrode layer; an organic light-emitting layer stack abutting the first electrode layer; a second electrode layer abutting the light-emitting layer stack; and a multilayer encapsulation abutting the second electrode layer, wherein the multilayer encapsulation comprises a barrier layer and a planarization layer, wherein the planarization layer directly abuts the second electrode layer, wherein the planarization layer is arranged between the second electrode layer and the barrier layer; and wherein the barrier layer is formed using plasma enhanced chemical vapor deposition (PECVD).

2. The optoelectronic component according to claim 1, wherein the barrier layer contains inorganic material selected from a group comprising SiN, SiO$_2$, SiC or combinations thereof.

3. The optoelectronic component according to claim 1, wherein the planarization layer is formed by inkjet printing.

4. The optoelectronic component according to claim 1, wherein the planarization layer has a root mean square roughness of <200 nm.

5. The optoelectronic component according to claim 1, wherein the encapsulation is flexible.

6. The optoelectronic component according to claim 1, wherein the barrier layer surrounds lateral edges of the planarization layer.

7. The optoelectronic component according to claim 1, further comprising a protective layer on the barrier layer.

8. An optoelectronic component comprising:
a first electrode layer;
an organic light-emitting layer stack abutting the first electrode layer;
a second electrode layer abutting the light-emitting layer stack; and a multilayer encapsulation abutting the second electrode layer, wherein the multilayer encapsulation comprises a barrier layer and a planarization layer, wherein the planarization layer abuts the second electrode layer, wherein the planarization layer is arranged between the second electrode layer and the barrier layer;

wherein the barrier layer surrounds lateral edges of the planarization layer; and wherein the optoelectronic component further comprises a protective layer on the barrier layer.

9. The optoelectronic component according to claim 8, wherein the planarization layer has a smaller area parallel to its main direction of extension than the barrier layer.

10. The optoelectronic component according to claim 8, wherein the planarization layer has a common interface with the barrier layer at the lateral edges.

11. The optoelectronic component according to claim 8, wherein the planarization layer has a thickness being selected from a range including 50 nm up to and including 1.2 µm.

12. The optoelectronic component according to claim 8, wherein the protective layer is an organic protective layer or a varnish on which laminated plastic or metal foils are applied.

13. The optoelectronic component according to claim 8, wherein the barrier layer is formed using plasma enhanced chemical vapor deposition (PECVD).

14. The optoelectronic component according to claim 8, wherein the barrier layer contains inorganic material selected from a group comprising SiN, $SiO_2$, SiC or combinations thereof.

15. The optoelectronic component according to claim 8, wherein the planarization layer is formed by inkjet printing.

* * * * *